United States Patent [19]

Nakatsuka

[11] Patent Number: 4,692,788

[45] Date of Patent: Sep. 8, 1987

[54] SEMICONDUCTOR DEVICE WITH SOLDER OVERFLOW PREVENTION GEOMETRY

[75] Inventor: Masanori Nakatsuka, Itami, Japan

[73] Assignee: Mitsubishi Denki Kabushiki Kaisha, Tokyo, Japan

[21] Appl. No.: 946,127

[22] Filed: Dec. 24, 1986

Related U.S. Application Data

[63] Continuation of Ser. No. 659,349, Oct. 10, 1984.

[30] Foreign Application Priority Data

Nov. 5, 1983 [JP] Japan .............................. 58-207721

[51] Int. Cl.⁴ ............................................. H01L 23/28
[52] U.S. Cl. ........................................ 357/72; 357/65; 357/68; 357/71; 357/81
[58] Field of Search ...................... 357/72, 67, 68, 81, 357/81 C, 55, 71, 65, 56

[56] References Cited

U.S. PATENT DOCUMENTS

| | | | |
|---|---|---|---|
| 3,311,798 | 3/1967 | Gray | 357/81 X |
| 3,399,332 | 8/1968 | Savolainen | 357/81 |
| 3,434,018 | 3/1969 | Boczar et al. | 357/81 |
| 3,657,611 | 4/1972 | Yoneda | 357/67 X |
| 4,143,395 | 3/1979 | Sekiba | 357/81 X |
| 4,248,920 | 2/1981 | Yoshizumi et al. | 357/72 X |

FOREIGN PATENT DOCUMENTS 1054422 1/1967 Fed. Rep. of Germany ........ 357/68

Primary Examiner—Andrew J. James
Assistant Examiner—William A. Mintel
Attorney, Agent, or Firm—Lowe Price LeBlanc Becker & Shur

[57] ABSTRACT

A semiconductor apparatus comprises a semiconductor pellet having upper and lower main surfaces, and upper and lower protector plates against thermal stress soldered to the upper and lower main surfaces, respectively, of the semiconductor pellet wherein the whole area of the lower protector plate is larger than the lower main surface but has an inner part smaller than the lower main surface and made thicker than an outer part by being bounded with a step, the inner portion being soldered to the pellet at the lower main surface region, whereby the surface of the outer portion is spaced from the lower main surface by a distance corresponding to the height of the step.

4 Claims, 2 Drawing Figures

SEMICONDUCTOR DEVICE WITH SOLDER OVERFLOW PREVENTION GEOMETRY

This application is a continuation of application Ser. No. 659,349, filed Oct. 10, 1984.

BACKGROUND OF THE INVENTION

1. Field of the Invention

The present invention relates to a semiconductor device. More specifically, the present invention relates to a protector for protecting a semiconductor pellet from thermal stress.

2. Description of the Prior Art

A resin sealed semiconductor device is more advantageous as compared with a hermetically sealed apparatus in view of its compactness and low cost in manufacture. One example of a resin sealed semiconductor device is disclosed in Japanese Utility Model Laying-Open Gazette No. 155455/1981, in which a structure for enhancing moisture resistance is disclosed, although the disclosure is of less interest to the present invention.

FIG. 1 is a sectional view of an internal structure of a resin sealed semiconductor apparatus according to the prior art in which a semiconductor basic element is shown comprising a semiconductor pellet 1 soldered between protector plates 2 and 3. The protectors 2 and 3 are then soldered to outer electrodes 4 and 5, respectively, while the electrode 5 is mounted to an insulating plate 7 fixed to a copper radiator base 6. The radiator base 6 and a wall 8 of polybutylene telephthalate resin together form a vessel, filled with epoxy resin 9 sealing the semiconductor basic element. When the semiconductor pellet is a thyristor, for example, the same comprises P, N, P layers with a passivation layer G of glass coated on the junction portions 1a between the respective layers, so that the junction portions may be protected in a stabilized state.

In such resin sealed semiconductor apparatus, molybdenum and tungsten having substantially the same coefficient of thermal expansion as that of the semiconductor pellet 1 and having a larger mechanical strength are used as a material for the protectors 2 and 3 against thermal stress. These protectors 2 and 3 protect the semiconductor pellet 1 from thermal stress due to external temperature cycle, the Joule heat caused by a current and the like.

The size of the lower protector 3 is selected to be usually larger than the upper protector 2 on the upper surface of the pellet having a gate, because the larger protector 3 is adapted to be grasped by a jig so that the semiconductor basic element may be held during manufacturing. However, when soldering the protectors 2 and 3 to form a basic semiconductor element by allowing same to pass through a furnace containing hydrogen atmosphere of a predetermined temperature, it is possible that excessive solder might adversely affect the characteristics of the formed basic element. More specifically, since the upper protector 2 is smaller than the upper main surface of the pellet 1, the solder material 10 which may consist of 92.5% Pb, 5% In and 2.5% Ag, for example, interposed therebetween does not flow out to spread beyond the upper surface area of the pellet 1; however, since the lower protector 3 is larger than the lower main surface of the pellet 1, an excessive portion of the solder material 11 interposed therebetween could spread beyond the lower surface of the pellet on the protector 3, thereby causing a small protuberance 11a as shown. Such a protuberance 11a could disadvantageously cause an electrical discharge between the same and the end portion 1a of the pellet.

SUMMARY OF THE INVENTION

Accordingly, a principal object of the present invention is to provide a semiconductor apparatus comprising a protector which is large enough to be held by a jig and prevents excessive soldering material from spreading widely thereon.

The semiconductor device of the invention comprises a semiconductor pellet having upper and lower main surfaces, and upper and lower protector plates soldered respectively on the upper and lower surfaces of the semiconductor pellet for protection against thermal stress. The overall area of the lower protector plate, comprised of inner and outer parts, is larger than the lower main surface of the semiconductor pellet, however, the inner part of the lower plate smaller than the lower main surface of the semiconductor pellet and thicker than the outer part to define a step therebetween. The inner part is soldered to the pellet on the lower main surface thereof whereby the upper surface of the outer part is spaced from the lower main surface by a distance corresponding to the height of the step.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
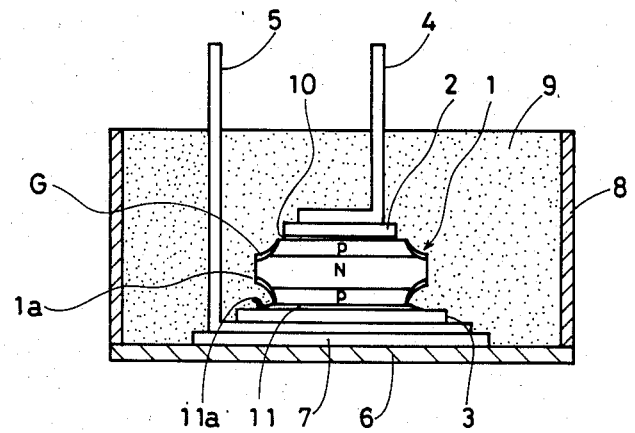
FIG. 1 is a sectional view of a conventional resin sealed semiconductor apparatus.
Figure 2:
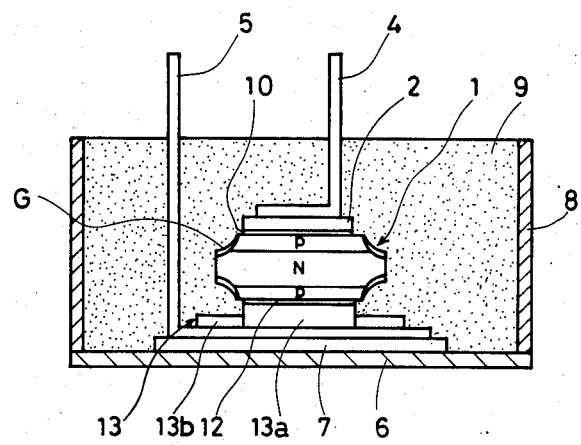
FIG. 2 is a sectional view of one example of a resin sealed semiconductor apparatus in accordance with the present invention.

In FIG. 2 the same reference characters as those in FIG. 1 denote the same or like portions. More specifically, the semiconductor apparatus of FIG. 2 comprises a two part protector 13 for thermal stress on the lower side and a soldering material 12 thereon. Since the other portion in FIG. 2 are the same as those in FIG. 1, a detailed description thereof will be omitted.

The overall area of the lower protector 13 is larger than the lower main surface of the semiconductor pellet 1, however, an inner part 13a is smaller than the lower main surface of the semiconductor pellet 1 and is made thicker than an outer part 13b to define a step therebetween. The inner part 13a is soldered to the pellet at the lower main surface area and accordingly the surface of the outer part 13b is spaced from the main surface by the distance corresponding to the height of the above described step. The inner part 13a is preferably made of molybdenum, while the outer part 13b is of copper. Preferably, these two portions are coupled by forcedly inserting or caulking the inner part 13a into the central aperture of the outer part 13b.

When the lower protector 13 is soldered to the semiconductor pellet as described above, an overflow of excessive soldering material 12, even if such occurs, would at most reach the periphery of the inner part 13a, inasmuch as the inner part 13a joined to the lower main surface is smaller than the main surface thereof. Accordingly, a protuberance such as shown at 11a in FIG.

1 would not be formed and the undesirable characteristic of electric discharge, as described above, is avoided.

Based upon experimentation, when soldering is performed in a furnace of hydrogen atmosphere at a temperature of 250° to 350° C., the conventional semiconductor element of FIG. 1, degradation in the range of 7 to 10%, whereas the embodiment in accordance with the present invention exhibits degradation of less than 0.1%.

Meanwhile, in the foregoing the embodiment was described which employs a semiconductor pellet for a thyristor including a glass passivation, it is to be appreciated that the present invention is applicable to any other semiconductor pellets.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor apparatus, comprising:
   a semiconductor pellet having upper and lower main surfaces,
   upper and lower protector plates respectively soldered to said upper and lower main surfaces of said semiconductor pellet to reduce thermal stress,
   the whole area of the lower protector plate being larger than the whole area of said lower main surface, said lower protector plate having a separate inner part of molybdenum with its entire upper surface substantially entirely in contact with and of smaller area than the lower main surface and an outer part of copper or like material of lesser thickness than the separate inner part to define therewith a step, the inner part being soldered along said upper surface to said pellet at said lower main surface region thereof, an upper surface of said outer part thereby being spaced from said lower main surface by a distance corresponding to the height of said step wherein said outer part has a central aperture receiving said inner part in force fitting engagement.

2. A semiconductor apparatus in accordance with claim 1, wherein said semiconductor pellet is sealed in resin.

3. The semiconductor apparatus of claim 1, wherein said central aperture extends entirely through the thickness of the outer part and a lower surface of the inner part is flush with a lower surface of the outer part via forceable insertion into the central aperture.

4. A semiconductor apparatus, comprising:
   a semiconductor pellet having upper and lower main surfaces;
   upper and lower protector plates respectively soldered to the upper and lower main surfaces of said semiconductor pellet to reduce thermal stress;
   a radiator base supporting said upper and lower protector plates and said semiconductor pellet, said radiator base having a surface area greater than the surface area of the lower protector plate;
   wherein the area of the lower protector plate is larger than the lower main surface of the semiconductor pellet and includes a separate inner part of molybdenum and an outer part supported by the radiator base, said inner part being received within a central aperture of the outer part being of copper or like material other than molybdenum said inner part having an upper surface being of smaller area than the lower main surface it is in direct contact with and said inner part being thicker than the outer part to define a step therewith, said inner part being soldered to the pellet at a lower main surface region thereof, whereby the upper surface of said outer part is spaced from the lower main surface by a distance corresponding to the height of the step.

* * * * *